United States Patent [19]

Mayo

[11] Patent Number: 5,182,558
[45] Date of Patent: Jan. 26, 1993

[54] SYSTEM FOR GENERATING CORRECTION SIGNALS FOR USE IN FORMING LOW DISTORTION ANALOG SIGNALS

[75] Inventor: Frank Mayo, Houston, Tex.

[73] Assignee: Halliburton Geophysical Services, Inc., Houston, Tex.

[21] Appl. No.: 782,111

[22] Filed: Oct. 25, 1991

[51] Int. Cl.[5] .............................................. H03M 1/06
[52] U.S. Cl. .................................. 341/118; 341/120; 341/143
[58] Field of Search ............... 341/110, 118, 143, 144, 341/120

[56] References Cited

U.S. PATENT DOCUMENTS

| | | | |
|---|---|---|---|
| 4,316,178 | 2/1982 | Shibayama et al. | 340/347 |
| 4,340,882 | 7/1982 | Maio et al. | 340/347 |
| 4,399,426 | 8/1983 | Tan | 340/347 |
| 4,412,208 | 10/1983 | Akazawa et al. | 340/347 |
| 4,415,882 | 11/1983 | Akazawa et al. | 340/347 |
| 4,465,995 | 8/1984 | Sloane | 340/347 |
| 4,509,037 | 4/1985 | Harris | 340/347 |
| 4,542,354 | 9/1985 | Robinton et al. | 332/11 |
| 4,692,738 | 9/1987 | Suzuki | 341/110 |
| 4,835,535 | 5/1989 | Shibayama et al. | 341/120 |
| 4,843,390 | 6/1989 | Van Bavel et al. | 341/139 |
| 4,851,841 | 7/1989 | Sooch | 341/143 |
| 4,851,934 | 7/1989 | Takeuchi et al. | 360/64 |
| 4,862,169 | 8/1989 | Van Bavel et al. | 341/143 |
| 4,894,656 | 1/1990 | Hwang et al. | 341/120 |
| 4,896,155 | 1/1990 | Craiglow | 341/120 |
| 4,903,023 | 2/1990 | Evans et al. | 341/120 |
| 4,920,544 | 4/1990 | Endo et al. | 375/26 |
| 4,943,807 | 7/1990 | Early et al. | 341/120 |
| 4,951,052 | 8/1990 | Jacob et al. | 341/122 |
| 4,985,702 | 1/1991 | Penney | 341/118 |
| 4,999,625 | 3/1991 | Thompson | 341/118 |
| 5,047,772 | 9/1991 | Ribner | 341/156 |

OTHER PUBLICATIONS

D. W. Baker, The EDME Bit Stream Generator Program, May 16, 1986, place of publication unknown.
James C. Candy, Decimation for Sigma Delta Modulation, Jan. 1986, IEEE Transactions on communications, vol. Com-34, No. 1, place of publication unknown.
James C. Candy, A Use of Double Integration in Sigma Delta Modulation, Mar. 1985, IEEE Transactions on Communications, vol. Com-33, No. 3, pp. 249-258, place of publication unknown.

*Primary Examiner*—Marc Hoff
*Attorney, Agent, or Firm*—Arnold, White & Durkee

[57] ABSTRACT

A method and apparatus for generating correction signals for use in forming low distortion analog signals. A digital representation of a desired analog waveform is encoded into a digital data signal which is outputted to memory. A digital correction signal is encoded, having an opposite phase and increased amplitude from the signal distortion which it is determined will occur when the digital data signal is repetitively read out of memory and decoded. This digital correction signal is outputted to memory. The digital data and correction signals are repetitively and synchronously read out of memory into a decoder. The decoder converts both digital signals into analog signals, so that the analog correction signal may superpose on the distortion in the analog data signal, resulting in a low distortion analog signal.

34 Claims, 5 Drawing Sheets

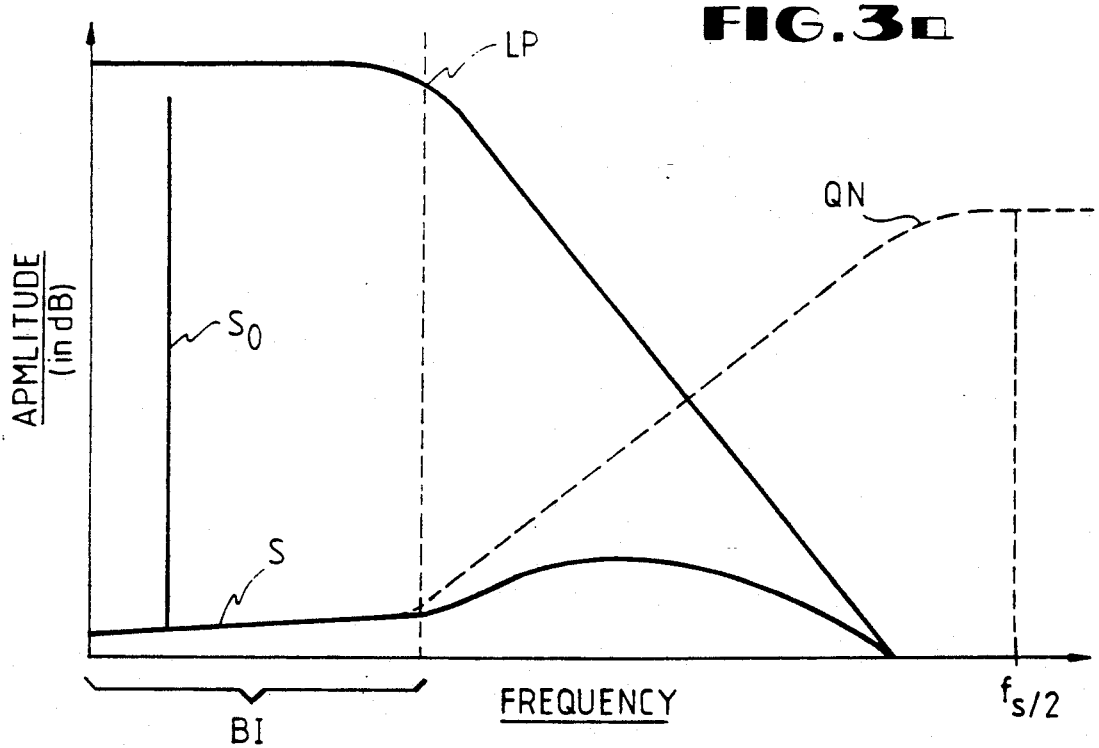
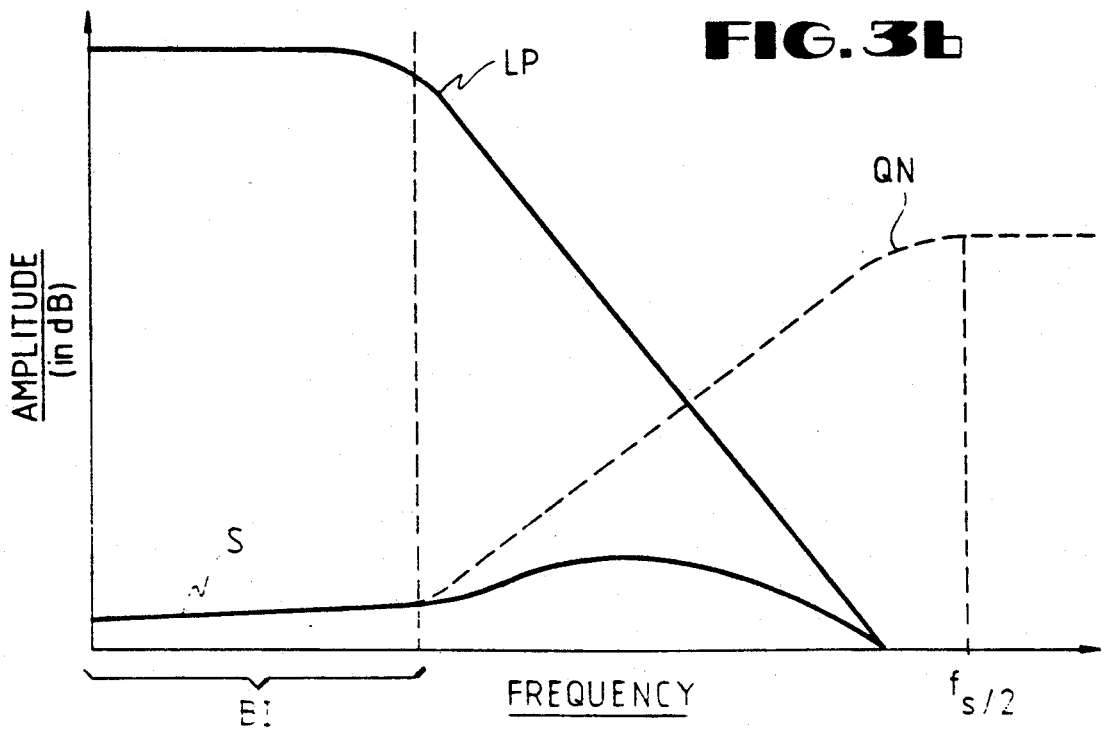

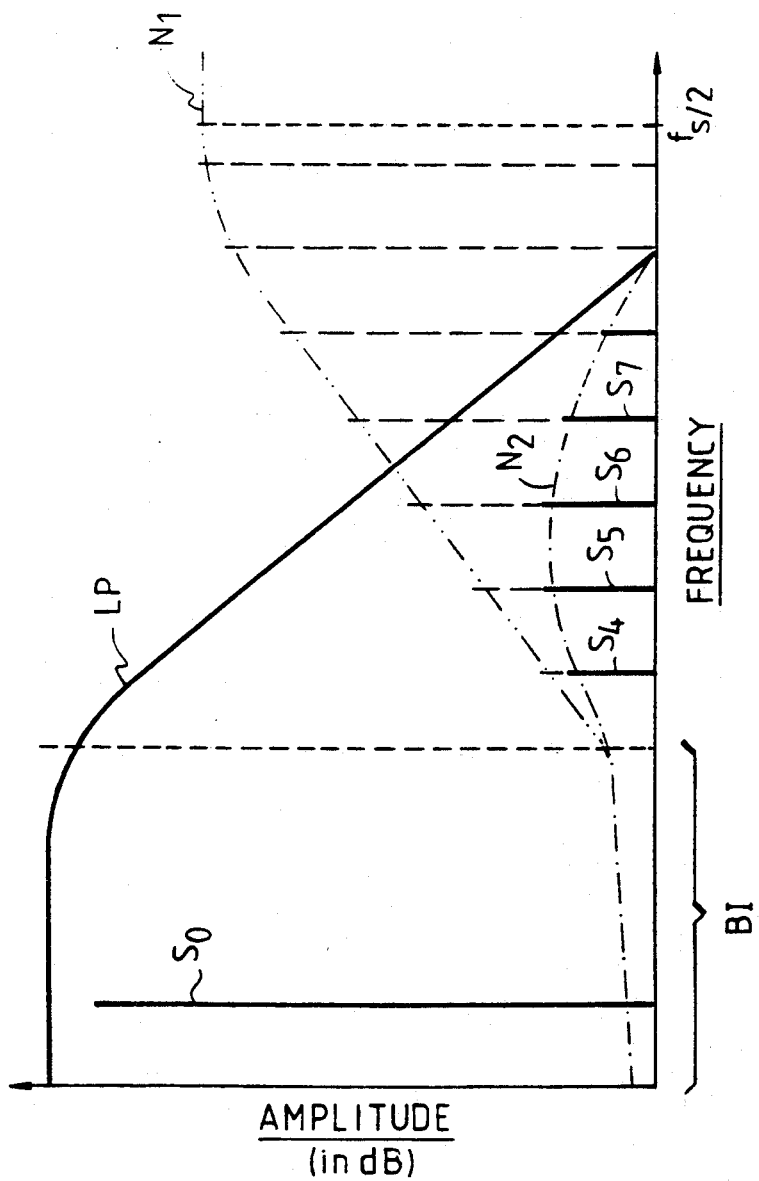

SYSTEM FOR GENERATING CORRECTION SIGNALS FOR USE IN FORMING LOW DISTORTION ANALOG SIGNALS

BACKGROUND OF THE INVENTION

The present invention relates generally to a method and apparatus for generating correction signals for use in forming low distortion analog signals and, more particularly, to a correction signal generator that encodes a desired signal waveform into a digital data signal and a digital correction signal and stores such signals, and subsequently reads out the stored digital signals and decodes the signals into analog signals that may be summed into the desired low or ultra-low distortion analog signal.

Recent advances in analog signal processing technology have created a need for testing and other devices capable of generating purer and purer analog signals. Digitizers (such as A/D converters) now exist that are capable of 120 dB of dynamic range without interference from noise or distortion, and in the near future it is anticipated that signal processing technology will exist for analyzing analog signals with signal to noise and distortion ratios as high as 150 dB. However, before the new signal processing technology can be effectively implemented, especially in field applications such as seismic exploration, a means must exist for calibrating and testing these new digitizers. Because there are additional constraints such as power and weight limitations affecting equipment used in the field, the solution to this need has been elusive until now.

It should be recognized that there are many devices used for generating analog signals which are well known in the art. In particular, it is well known that many varieties of D/A converters exist which can be used to convert digital signals to analog signals. Further, successive approximation D/A converters, particularly when oversampled, have been used with some success to achieve signal to noise and distortion ratios of up to 100 dB for digital signals having as many as 18 bits.

However, it is difficult to achieve greater than 100 dB signal to noise and distortion ratios using such technology. For example, the successive approximation converters typically use a weighting source, whether it be a current source, voltage source, or resistors. These weighting sources are difficult to control and maintain accurate over time due to temperature fluctuations and other variables, particularly when more than 16 to 18 bits of input are used in the D/A converter. Thus, the recent advances in analog signal processing technology render the past state of the art of test signal generation practically useless; a new means of generating analog signals with a signal to noise and distortion ratio exceeding that of the new A/D technology is needed. Further, there is a particular need for analog signal sources that are portable and can be used for field calibration of the new digitizers.

A solution to this problem might be found in the use of a device that converts a continuously generated digital datastream into a desired analog signal. Such a datastream might be a sequence of discrete time data values, such as a digital bitstream. A device such as a DPCM (differential pulse code modulator) might then be used to convert, or used as a model for a program to computationally convert, the datastream into an analog signal. Also, there might be advantages in using a computational program modeled on one bit D/A converter circuits, found in the feedback loops of sigma delta digitizers. Such one bit D/A converters provide linear signals and, particularly with the well-known sigma delta converter, make encoder/decoder modeling easier.

But, while such an approach may produce low noise signals, the approach would not be feasible for applications such as field use. The computations required to continuously generate an appropriate digital bitstream, capable of conversion to a desired low or ultra-low distortion analog signal, would include high speed reiterative solutions of a system of equations and require a continuous high level of power consumption. This level of computational power is highly undesirable in field equipment, which is desired to operate at as low power as practical. In fact, with respect to field applications it is estimated that the equipment needed for computing such a signal could require as much as double the power needed for current field testing equipment, and would increase the speed and cost of the computational equipment.

Thus, there is a continuing need for a system of generating a digital signal and using this signal to form an analog signal with low or ultra-low distortion, but without significant extra requirements or expenses for computational equipment and power supplies.

SUMMARY OF THE INVENTION

In a board aspect, the present invention comprises a signal generator for computationally generating digital datastreams and decoding such datastreams into analog signals that may be combined to form a low distortion analog signal. The signal generator includes the following component parts: a data signal source for outputting a desired digital data signal datastream; an encoder means for encoding the digital data signal datastream into a digital correction signal datastream; and one or more memory storage devices for storing these digital datastreams. Additionally, the signal generator may include a digital to analog decoding system for reading the digital datastreams out of memory and converting said datastreams into analog signals that may be further summed to form an analog signal having ultra-low distortion and the desired waveform.

The data signal source in one aspect encodes a periodic waveform from memory into a data digital datastream. The encoder generates a correction signal by (1) determining, based on the data digital datastream, the frequency, phase and amplitude of signal distortion that will occur when the data digital datastream is repetitively read out from the memory storage device and decoded, and (2) encoding the determined distortion into a correction signal digital datastream having the same frequency but opposite phase from that of the estimated distortion, and preferably an appropriately scaled amplitude.

After encoding the digital datastreams, the data signal source and the encoder output the digital datastreams to a memory storage device. The memory storage device may be separate to detachable from the data signal source and encoder, such that the memory storage device and a decoder may be separately transportable, as for use in bench testing and field applications.

When desired, the digital data signal datastream and correction signal datastream are repetitively and synchronously read out of memory into the decoder.

Where the digital correction signal has been encoded to include a scaled amplitude relative to the estimated distortion, the decoded correction signal is appropriately unscaled, such that the decoded correction signal has signal components in the band of interest having the same frequency and amplitude, but opposite phase form, the distortion in the decoded data signal. The decoder sums both signals in the analog domain so that the correction signal superposes with the data signal. The invention is thereby capable of producing output correction signals that may form low or ultra-low distortion analog signals. Thus, analog signals capable of signal/noise ratios greater than about 120 dB, and especially greater than about 150 dB, are contemplated.

In a more particular aspect of the present invention, a signal generator is provided which includes a computational means for encoding a desired discrete time, periodic waveform into a digital datastream. A segment of this data digital datastream, corresponding to a period of the periodic waveform, is stored in a memory storage device. The phase and amplitude of the signal distortion of the data digital datastream are then computationally estimated, and a correction signal digital datastream containing distortion of opposite phase and appropriately scaled amplitude form that of the distortion components of the data signal is computationally encoded. A segment of the correction signal, corresponding to the same segment of the discrete time waveform as the stored data digital datastream, is stored in a memory storage device. Then, at a desired time and location, both the data signal and correction signal are repetitively and synchronously read out of memory. The digital datastreams are inputted to individual switches which are connected to both sides of a reference voltage source. These switches alternately output a positive or negative reference voltage as the data types in the inputted datastream alternate, for example, such as when the datastream is a bit stream and the bit types alternate between 0 and 1. The correction signal and the data signal outputted form the switches are then inputted into a summing low-pass filter which sums both the data signal and the correction signal, with appropriate scale factors, in the analog domain. The scaling of the signals is accomplished by use of resistors having appropriate resistances such that the resultant value of the amplitudes of the correction signal and of the distortion components of the data signal within the band of interest are the same, and may be superimposed to cancel the distortion. Thus, the analog output from the summing low pass filter becomes capable of ultra-low distortion.

In another aspect, the present invention comprises a method of generating a correction signal that, when summed with the data signal, forms a low or ultra-low distortion signal. The method includes the steps of encoding a discrete time waveform into a data signal which is a one-bit digital bitstream and storing a segment of this data signal in a memory. Next, the frequency, phase and amplitude of the signal distortion that the data signal will have when read out of memory are computed, and then encoded into a correction signal having opposite phase and appropriately scaled amplitude from the signal distortion of the data signal. A segment of this correction signal is then stored in a memory. Next, the data signal and correction signal digital bitstream segments are read out of memory repetitively and synchronously. Finally, the data signal and appropriately scaled correction signal are decoded, and the decoded signals are summed forming an analog signal which is capable of low or ultra-low distortion.

BRIEF DESCRIPTION OF THE DRAWINGS

FIG. 3(a) illustrates a graph of the analog signal (including signal noise) created where a digital data signal is continuously generated and decoded;

FIG. 3(b) illustrates a graph of the signal noise (without the fundamental of the data signal) created where a digital data signal is continuously generated and decoded;

FIG. 3(e) illustrates a graph of an ultra-low distortion analog signal resulting from the summing of decoded data and correction signals;

Figure 1A:
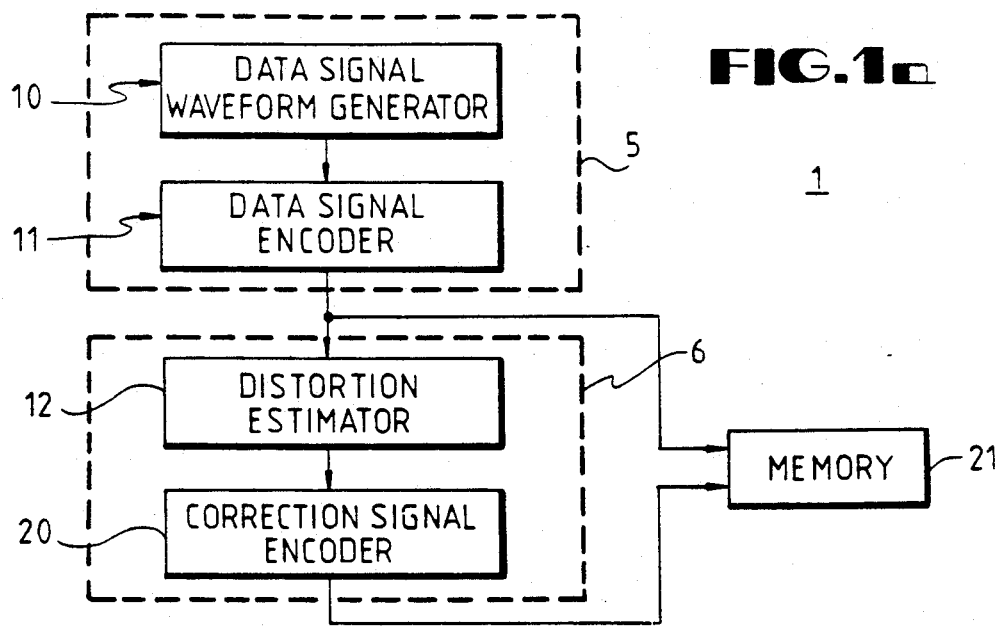
FIG. 1(a) depicts a block diagram of a preferred embodiment of computational stages through which a correction digital datastream, which may later be decoded along with a data digital datastream and combined to form a low or ultra-low distortion analog signal, is generated.

While the system is susceptible to various modifications and alternative forms, specific embodiments thereof have bene shown by way of example in the drawings and will herein be described in detail. It should be understood, however, that this specification is not intended to limit the invention to the particular forms disclosed herein, but, on the contrary, the intention is to cover all modifications, equivalents, and alternatives falling within the spirit and scope of the invention as defined by the appended claims.

DESCRIPTION OF THE PREFERRED EMBODIMENTS

Referring now to the drawings, FIG. 1(a), is a block diagram of the computational components of a signal generator 1, and a memory 21, in accordance with a presently preferred embodiment of the invention. All of these computational components are preferably composed of a computer using program steps as discussed below.

A digital data signal source 5 outputs a digital data signal segment. Because distortion in the outputted digital data signal segment limits the signal-to-noise ratio that may be achieved in the desired final output low distortion analog signal, the digital data signal source 5 preferably has characteristics such that it outputs a low or ultra-low distortion digital data signal segment. Preferably, such low-distortion digital output is achieved computationally, where the digital data signal source 5 includes a data signal waveform generator 10 and a data signal encoder 11.

Thus, preferably, a waveform generator 10 generates a digital representation of a desired discrete time, periodic waveform. This discrete time waveform will preferably be a periodic sinusoidal waveform, having approximately the same frequency, time, phase and amplitude characteristics as the final output analog signal (60) has within a frequency band of interest. Distortion, if any, remaining in the final output analog signal is desired to be ultra-low in amount. The waveform generator 10 output is preferably generated by using mathematical functions of a conventional software language, such as sinusoidal functions, and a program that adjusts the characteristics of the waveform, such as amplitude, phase or period, based on user inputs. Such software languages are well-known in the art, and an example of commercially available software language that works well as a waveform generator is Microsoft C. It should be recognized, however, that the waveform generator 10 may use other than electronic means, such as optical processing, to generate a digital representation of the periodic waveform; in such an event other means, such as optical processing means, may also be used, instead of electronic or computer means, to computationally encode the desired digital data and correction signal data stream segments. Further, the periodic sinusoidal waveform need not be a simple sinusoidal waveform, but may be a complex waveform such as one composed of many superimposed sinusoidal waveforms.

The output form the waveform generator 10, which is typically in the form of a continuous stream of multi-bit bytes, is computationally encoded into a digital datastream segment by the data signal encoder 11. The data signal encoder preferably encodes the digital datastream segment as a one-bit bitstream segment of one data signal cycle, although multiple-but bitstreams and other datastreams, and segments other than one data signal cycle in length, may also be used. The data signal encoder 11 preferably encodes the waveform generator 10 output by means of conventional software programming techniques, where such software programming preferably simulates the process of a sigma delta encoder, which is well-known in the art. An example of one such sigma delta encoder is shown at FIG. 1 in J. C. Candy, "Decimation for Sigma Delta Modulation," IEEE Transactionson Comms., Vol. Com-34, 72-76, Jan. 1986. One skilled in the art may readily develop a software program simulating such a sigma delta encoder. The resulting data signal digital datastream segment is then both stored in memory 21 and inputted into digital correction signal generator 6.

The digital correction signal generator 6 preferably includes a distortion estimator 12 and a correction signal encoder 20. The distortion estimator 12 computationally determines the phase and amplitude of the signal distortion created by repetitively reading out the data signal digital datastream segment from memory 21. The distortion estimator 12 has parameters such that it produces a distortion digital datastream containing distortion of opposite phase and appropriately scaled amplitude as that of the signal distortion that will result from repetitively reading out the data signal digital datastream segment from memory 21 Because the distortion digital datastream has an opposite phase, the correction signal (obtained by encoding the distortion digital datastream with the correction signal encoder 20) and data signal can be superposed in the analog domain. Consequently, any distortion remaining in the resulting signal is at an ultra-low level. Further, the amplitude of the distortion digital datastream (and hence the correction signal) may be increased, preferably by a scale factor much greater than 1. this increase is amplitude makes distortion in the correction signal itself, resulting when the correction signal is repetitively read out of memory, relatively negligible compared to the signal distortion determined by the distortion estimator 12 and encoded in the correction signal. Thus, the increase in amplitude practically eliminates any distortion that might otherwise be created by reading out the correction signal. However, it should be recognized that application of the scale factor may be omitted if the band of interest is so narrow that no multiples of the fundamentals of the correction signal (occurring as the digital correction signal segment is read-out and decoded) fall within the band of interest.

The distortion digital datastream information is outputted from the distortion estimator 12 and computationally encoded by the correction signal encoder 20. The correction signal encoder 20 has parameters such that it encodes the correction digital datastream by a similar method as that used by the data signal encoder 11, i.e., preferably by use of a software program simulating the process of a sigma delta encoder and preferably encoding the correction signal as a one-bit bitstream. Preferably the correction signal encoder 20 comprises the same software program s the data signal encoder 11. Thus, the correction signal encoder 20 produces a correction signal digital datastream segment containing distortion of opposite phase and appropriately scaled amplitude as that of the signal distortion resulting from repetitively reading out the data signal digital datastream segment from memory 21.

The output of the correction signal encoder 20, i.e., a correction signal digital datastream segment, is stored in memory 21. For economy of storage and ease of transportation, a single memory 21 preferably store both datastream segments, although more than one memory device or different locations on the same memory storage device may be used to store the datastream segments. Memory storage device 21 may be separate or detachable from the computational components of the signal generator 1, such that the memory storage device 21 may be transportable for uses including, but not limited to, laboratory or field applications.

Figure 1B:
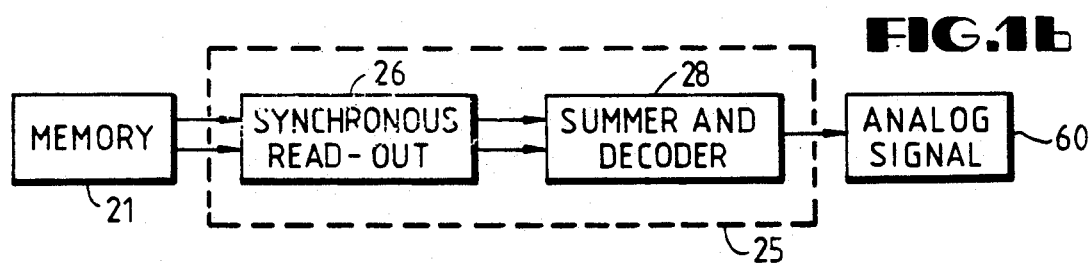
FIG. 1(b) depicts a block diagram of a preferred embodiment of stages of memory readout and decoding by which the data and correction digital datastreams, generated by the computational stages illustrated in FIG. 1(a), are converted into analog signals and summed into a low distortion analog signal.

Turning now to FIG. 1(b), this figure shows a block diagram of a preferred embodiment of the memory readout and decoding portions 25 that are used in converting the correction and data digital signals into analog signals that may be summed to form the desired low distortion analog signal. These portions ay be detachable and transportable separate from the computational components of the signal generator 1. A synchronous read out means 26 repetitively, continuously and synchronously reads out the data signal digital datastream segment and the correction signal digital datastream segment from memory 21. Circuits, which may serve as such synchronous read-out means 26, are well-known in the art. While it is preferable that the two digital datastream segments be synchronously read out of memory, what is important is that the data and correction signals are read out and decoded such that when summed, the correction signal may properly cancel out distortion in the data signal. Preferably the first data point (bit) of the correction signal digital datastream segment is read out at approximately the same point in time as the first data point (bit) of the data signal digital datastream segment, although these bit points may be synchronized subsequently in the decoding process. It is also preferred, to help insure a synchronous read out, that the first data point (bit) of the correction signal digital datastream segment corresponds to the same point in the cycle of the original waveform as the first data point (bit) of the data signal digital datastream segment. Similarly, because the digital datastreams will be read out of memory repetitively, the last data point (bit) of the correction signal digital datastream segment should also correspond to the same point in the cycle of the original waveform as the last data point (bit) of the data signal digital datastream segment. A properly programmed correction signal encoder 20 will help insure that the correction signal digital datastream is of sufficient length that, when the correction signal digital datastream is repetitively read out of memory 21, it can remain properly synchronized with the data signal digital datastream.

The data signal digital datastream and correction signal digital datastream are inputted into a decoder circuit 28. Decoder circuit 28 converts the digital datastreams into analog signals, appropriately scales the correction signal, and sums the analog signals. As the correction signal is superposed on the data signal, the correction signal acts to cancel distortion in the data signal (which resulted from repetitively reading out the data digital datastream segment from memory 21). The result of the superposed signals is a low or ultra-low distortion analog signal 60.

Figure 2:
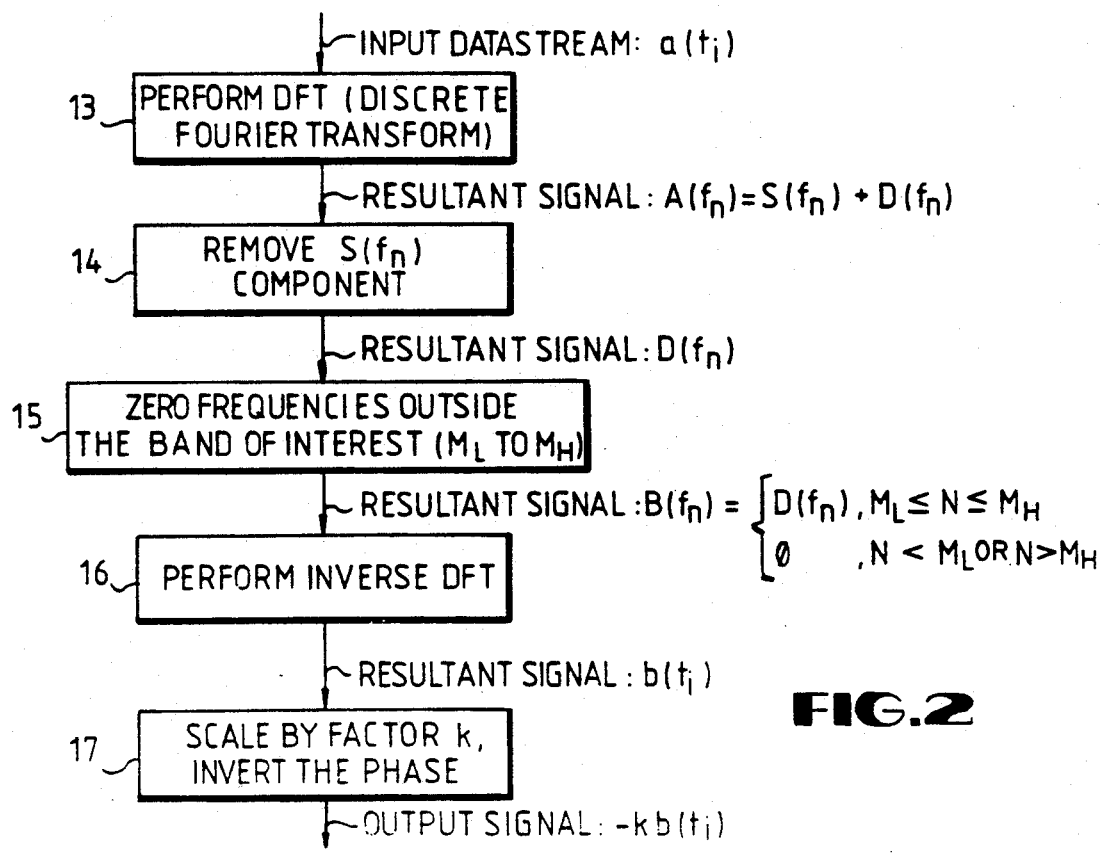
FIG. 2 illustrates a flow-chart of a preferred embodiment of computational steps by which the signal distortion, which the data digital datastream will have when later read out of memory, is computationally estimated and the correction digital datastream is encoded form the determined signal distortion.

FIG. 2 illustrates a flowchart of a preferred embodiment of the computational steps of distortion estimator 12. The digital datastream (a(d$_i$)) outputted from the data signal encoder 11 and inputted into distortion estimator 12 may be represented as having two components, a data signal (s(t$_i$)) and a signal distortion (d(t$_i$)). A discrete fourier transform (DFT) of the digital datastream a(t$_i$) may be performed (step 13), transforming the time domain signal a(t$_i$) to a frequency domain signal A(f$_n$)=S(f$_n$)+D(f$_n$), where S(f$_n$) is the frequency domain data signal component and D(f$_n$) is the frequency domain signal distortion component. It should be noted that while it is preferred to use a fourier transformation of the digital datastream when determining the signal distortion, any transformation process, such as Hartley transform, similarly allowing for a determination of the signal distortion information and the encoding of a correction signal having opposite phase, may be used. The use of a fourier transform results in D(f$_n$) being composed of a series of discrete frequencies, multiples of the fundamental S(f$_n$). S(f$_n$) is known from the spectral characteristics of the signal outputted from waveform generator 10 and may be removed from A(f$_n$)(step 14), leaving the distortion component D(f$_n$). Those values of D(f$_n$) for frequencies outside of the band of interest (m$_L$ to m$_H$) (which corresponds to the frequency band of interest from the low frequency m$_L$ to high frequency m$_H$ desired for the ultra-low distortion analog signal) may then be zeroed (step 15), so that any correction signal generated only corrects for distortion occurring in the band of interest. An inverse DFT may then be performed (step 16) on the resulting signal (B(f$_n$)), yielding a time domain signal b(t$_i$). Finally, b(t$_i$) is preferably multiplied by a scale factor k, which is much greater than 1, and converted to an opposite phase (step 17), thus yielding the desired correction signal digital datastream ($-kb(t_i)$). The opposite phase allows the correction signal to superpose and cancel distortion components of the data signal when the signals are later converted and summed as analog signals. The scale factor allows additional distortion, occurring as the correction signal segment is repetitively read out of memory 21 and decoded, to be kept much less than the other components of the decoded correction signal. Thus, after the correction signal is converted to an analog signal and divided by an appropriate second scale factor, such additional distortion becomes practically negligible, while the other components of the correction signal are appropriately scaled down so they can cancel with distortion in the data signal.

For an example of how a fourier analysis of such a correction process might work, let g(t) represent the original signal as a function of time. Then a segment $\tau$ long centered at time t$_1$ may be represented by the expression:

$$g(t) \cdot \pi\left(\frac{t}{\tau} - t_1\right)$$ Equation 1 where $\pi((t/\tau)-t_1)$ is a rectangular unit amplitude pulse of length $\tau$ centered at time t$_1$ (sometimes referred to as a window or box car function).

Repeating this segment can be expressed as $$h(t) = \left[g(t) \cdot \pi\left(\frac{t}{\tau} - t_1\right)\right] * \Sigma^m \delta(t - m\tau)$$ Equation 2

Taking the fourier transform of h(t) to examine this relation in the frequency domain, one obtains:

$$H(f) = [G(f) * \tau\text{sinc } f\tau e^{-i\omega\tau t_1}] \frac{1}{\tau} \Sigma^n \delta\left(f - \frac{n}{\tau}\right)$$ Equation 3

If the signal is a sinusoid with one cycle in the segment window, making G(f)=$\delta$(f± (1$\tau$)), and t$_1$=0, then $$H(f) = \left[\delta\left(f \pm \frac{1}{\tau}\right) * \text{sinc } f\tau\right] \cdot \Sigma^n \delta\left(f - \frac{n}{\tau}\right)$$ Equation 4

$$= \left[\text{sinc}\left(f \pm \frac{1}{\tau}\right)\tau\right] \Sigma^n \delta\left(f - \frac{n}{\tau}\right).$$ Equation 5 the sinc function is centered at the signal frequency and sampled at all multiples of f$_r$. But, note that all multiples except ±1 are nulls of the sinc function.

If the segments are l·$\tau$ long, instead of just $\tau$ long, then $$h(t) = \left[g(t) \cdot \pi\left(\frac{t}{l\tau} - t_1\right)\right] * \Sigma \delta(t - ml\tau) \text{ and}$$ Equation 6

-continued $$H(f) = [G(f) * l\tau \text{sinc } fl\tau e^{-i\omega l\tau l}] \frac{1}{l\tau} \Sigma \delta\left(f - \frac{n}{l\tau}\right) \quad \text{Equation 7}$$

Again, if the signal only contains a sinusoid, then $$G(f) = \delta\left(f \pm \frac{1}{\tau}\right), \text{ and } t_1 = 0, \text{ making} \quad \text{Equation 8}$$

$$H(f) = \left[\text{sinc}\left(f \pm \frac{1}{\tau}\right)l\tau\right]\Sigma \delta\left(f - \frac{n}{l\tau}\right) \quad \text{Equation 9}$$

Here, H(f) equals the sinc function centered at $f = b\ 1/\tau = f_r$ and sampled at all multiples of $f = 1/l_r = f_r l$, which are the nulls, $f_n = nf_r/l$, of the more narrow sinc function.

If G(f) is a continuous function such as obtained from the quantization noise, as well as a sinusoid, in a digital datastream data signal, then the expression in brackets will be continuous in the frequency domain and sampled at $f = n/\tau = nf_r$, which are fundamental multiples. However, if a datastream containing more than one sine cycle is repetitively read out, the frequency domain samples of the continuous spectrum at $f = n/l\tau = (n/l)f_r$, yield fractional multiples of the signal frequency as well as integer ones. Thus, it is preferable to read out a datastream segment containing one sine cycle.

In order to obtain the desired correction signal, one embodiment of the distortion estimator preferably includes the use of a digital notch, or FFT (fast fourier transform), to remove the signal of the sinusoid waveform. The residual signal, the fundamental multiples, are then encoded with the same relative magnitude but opposite phase and a scale factor much larger than one, preferably greater than 100, although a scale factor less than or much greater than 100 may be used depending on the signal to noise ratio desired in the correction signal. When the resulting correction signal is subsequently decoded, scaled down, and summed with the data signal the fundamental multiples are negated, and the signal to noise ratio of the combined signal is increased to as much as 150 dB or more in the band of interest.

The scale factor is limited by the noise in $\{G(f)*\tau \text{ sinc } f\tau\}$ over the band of interest. This scale factor might be about 30 if one wanted to remove all the noise at all frequencies. But, this scale factor would be significantly higher if one only sought to remove the noise (fundamental multiples) over a small band of interest. Thus, it is likely more efficient, and preferred, to use a high scale factor with an analog low pass filter to eliminate the higher frequency fundamental multiples, using a very highly oversampled signal.

Figure 3C:
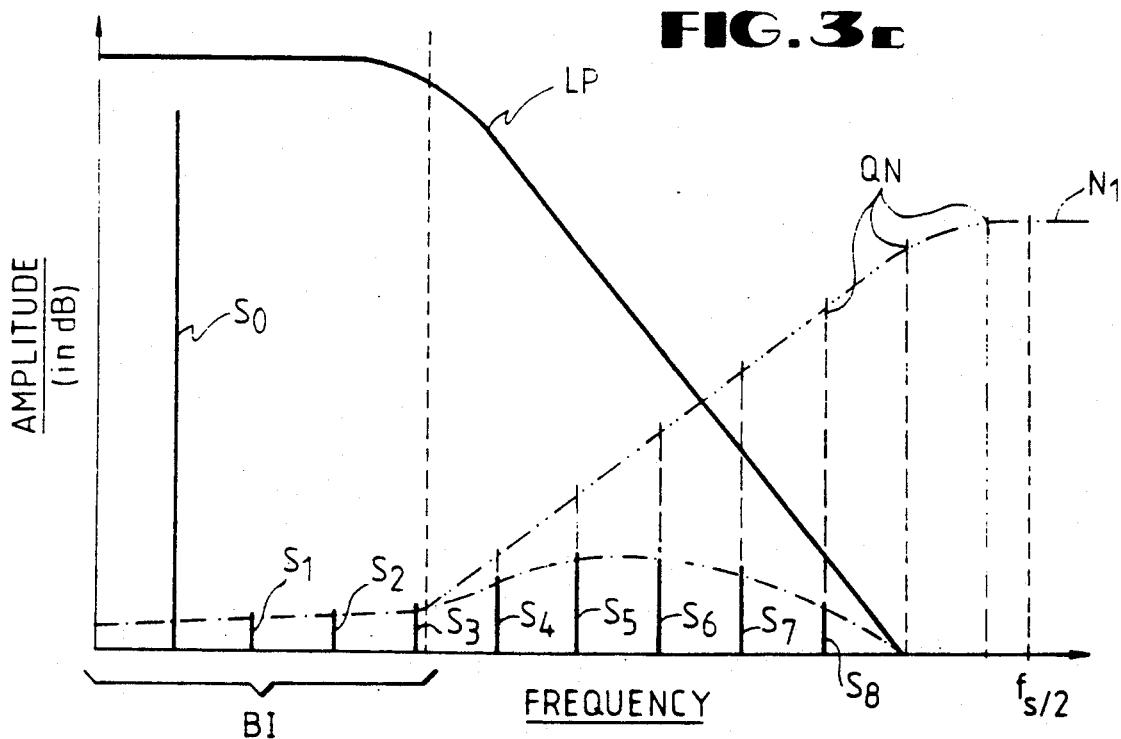
FIG. 3(c) illustrates a graph of the analog signal (including signal noise) created where an one period segment of a digital data signal is repetitively read out of a memory source and decoded.

Turning now to FIG. 3(a) through FIG. 3(e), graphs of illustrative types of signals and signal noise are shown. FIG. 3(a) illustrates the analog signal (including signal noise) that may result from a continuously generated and decoded data signal. In particular, FIG. 3(a) illustrates a sinewave signal that has been continuously generated, encoded into a digital bitstream by a program simulating sigma delta modulation, and decoded into an analog signal S. The sinewave itself has a frequency denoted by the portion of the analog signal at $S_0$. The remainder of signal S is quantization noise that occurs as the digital bitstream is decoded into an analog signal. Absent any filtering, this quantization noise would continue increasing in amplitude (illustrated by dotted line QN) as the frequency approaches the Nyquist Rate ($f_s/2$, where $f_s$ is the bitstream data rate). However, by over-sampling the band of interest and employing a low pass filter (where, as here, the low pass filter has frequency and amplitude characteristics such as illustrated by line LP), the amplitude of the noise outside of the band of interest may be significantly reduced, as illustrated by the amplitude of signal S outside of the band of interest (BI). However, as seen in FIG. 3(a), there remains a not insubstantial component of noise inside the band of interest. FIG. 3(b) further shows what this noise would look like if the fundamental sinewave signal information ($S_0$) was absent from analog signal S.

As this point it should be noted that, while no set ratio of the band of interest to the Nyquist rate is preferred, the more oversampled the signal can be, as determined by one skilled in the art taking into account cost and equipment constraints with the signal characteristics desired, the more that the noise in the band of interest can be minimized. Thus, in a preferred embodiment, the data signal encoder encodes the output signal from the waveform generator in a manner that is similar to the encoding of an oversampled sigma delta encoder. By doing so, the noise in the band of interest is greatly reduced, and the remaining signal may have a signal/noise ratio greater than 120 dB, and preferably even greater.

As FIG. 3(c) illustrates, when a data signal digital bitstream segment is repetitively read out of memory, all of the continuous noise spectrum is forced into discrete frequencies ($S_1$, $S_2$, ...) by the replication in time process. The resulting noise signals resemble harmonics, but are multiples of the fundamental ($S_0$) resulting from replication in time of the quantitization noise in the bitstream segment. The dotted lines represent as follows: $N_1$—what the quantitization noise of a continuously generated and decorded bitstream would have looked like (without low pass filtering); $N_2$—what such quantitization noise would have looked like with low pass filtering; and QN—what the quantitization noise of a bitstream segment, repetitively read out and decoded, would have looked like (without low pass filtering). The amplitude of these fundamental multiples ($S_1$, $S_2$, ...) is weighted by the window function used to select the bitstream segment to be replicated. By thus forcing the noise into discrete frequencies one is then able to remove the noise by creating a second, correction bitstream segment with opposite phase from these fundamental multiples, and adding the two signals in an appropriate manner.

Figure 3D:
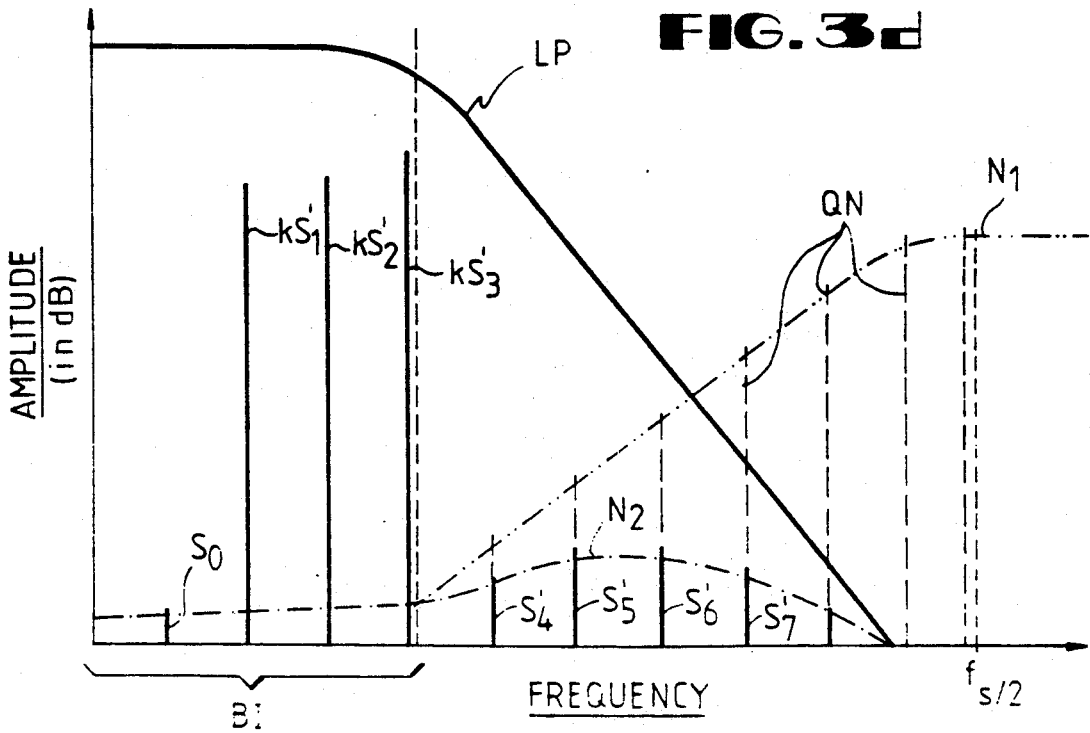
FIG. 3(d) illustrates a graph of a decoded correction signal.

FIG. 3(d) illustrates a repetitively read out and decoded correction signal. Again, all the quantization noise has been forced into discrete multiples of the fundamental ($S_1$, $S_2$, ...). Inside the band of interest (BI), the fundamentals of the correction signal have amplitude value k times the amplitude of the fundamentals and an opposite phase from, the data signal (i.e., $-kS$, $-kS_2$, $-kS_3$). Prior to summing this correction signal with the data signal, the amplitude of the correction signal will be appropriately scaled down, so that when the data signal is summed with the correction signal, the fundamentals in the correction signal within the band of interest will have the same amplitude (i.e., $S'_1$, $S'_2$, $S'_3$), but opposite phase, as the fundamentals in the data signal within the band of interest (i.e., $S_1$, $S_2$, $S_3$). By scaling down the correction signal, all other components of the correction signal ($S'_0$, $S'_4$, $S'_5$, . . . ) are also scaled down, and may be scaled down (depending on the initial scale factor used in the distortion estimator 12) to the level where the amplitude of these other components is small enough in relation to the signal component ($S_0$) of the data signal to subsequently yield, when the data signal is summed with the correction signal, low signal to noise ratio in the summed signal, preferably greater than 120 dB. FIG. 3(e) illustrates what an appropriately summed correction signal and data signal may look like in the band of interest (i.e., $S_0$, an ultralow distortion analog signal).

Figure 4:
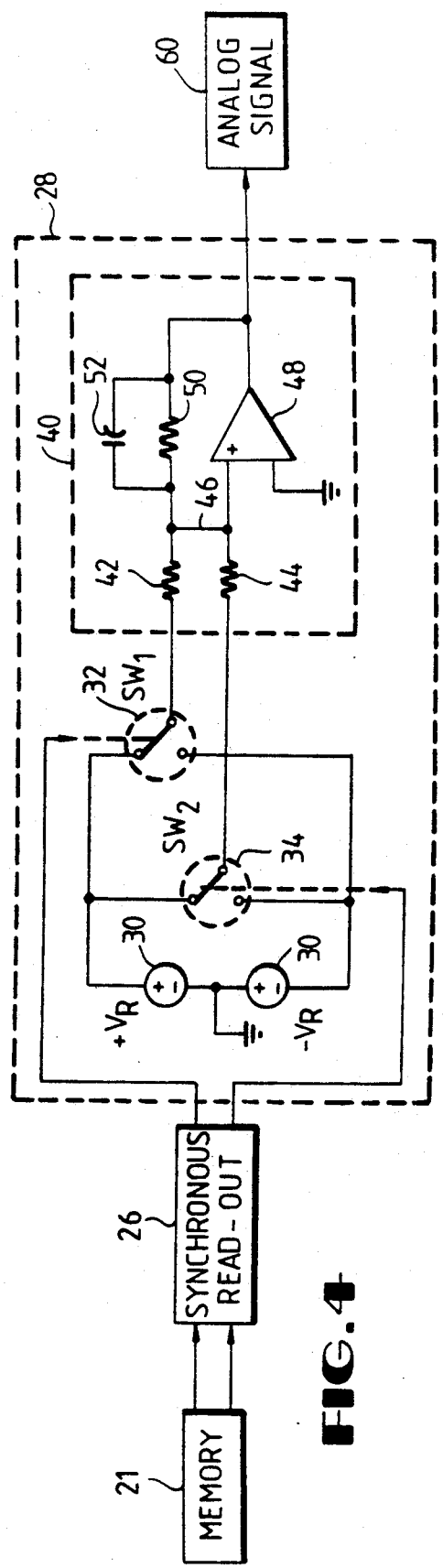
FIG. 4 illustrates a block diagram of a preferred embodiment of a memory readout and decoding circuit used to convert the data and correction digital datastreams and sum them to form a low distortion analog signal.

Referring to FIG. 4, one preferred embodiment of the decoder circuit 28 is illustrated. The decoder circuit 28 includes two reference voltage sources 30 and two switches, $SW_1$ 32 and $SW_2$ 34. Each switch is connected to the two sides of reference voltage sources 30, and has an output to summing low pass filter 40. The switches are switched between connections to the two sides, typically a positive and a negative side, of the voltage sources 30, as the bit types in the inputted digital bitstreams change between 0 to 1. Thus, the data signal digital bitstream, read out from memory 21 by synchronous read out device 26, is inputted to switch $S_1$ 32. Similarly, the correction signal digital bitstream, read out from memory 21 by synchronous read out device 26, in inputted to switch $SW_2$ 34. An example of a switch that may be used as switch 32 or 34 is the Siliconix DG444.

The data signal output from switch $SW_1$ 32 is inputted to summing low pass filter 40 through resistor 42. The correction signal output from switch $SW_2$ 34 is inputted to summing low pass filter 40 through resistor 44. Resistor 44 is of a resistance relative to resistor 42 such that it imposes an appropriate scale factor on the correction signal relative to the data signal, thus scaling the correction signal down so that the originally scaled components of the correction signal may cancel with the distortion components of the data signal in the band of interest. The two signals are then summed through the summing connection 46. The resultant signal is inputted to the negative input of opamp 48. The feedback loop for the summing low pass filter includes a resistor 50 and capacitor 52. The components of summing low pass filter 40 are conventional, and one skilled in the art will understand how to choose an appropriate filter with characteristics for filtering the signal frequencies outside the desired band of interest. Finally, the resulting signal outputted from the summing low pass filter 40 is the desired low distortion analog signal 60.

While this embodiment has been described as using voltage sources 30, in conjunction with resistors 42 and 44, to supply currents in the decoder circuit 28, it should be recognized that other means, such as a current source, may be used in lieu of a voltage source.

Figure 5:
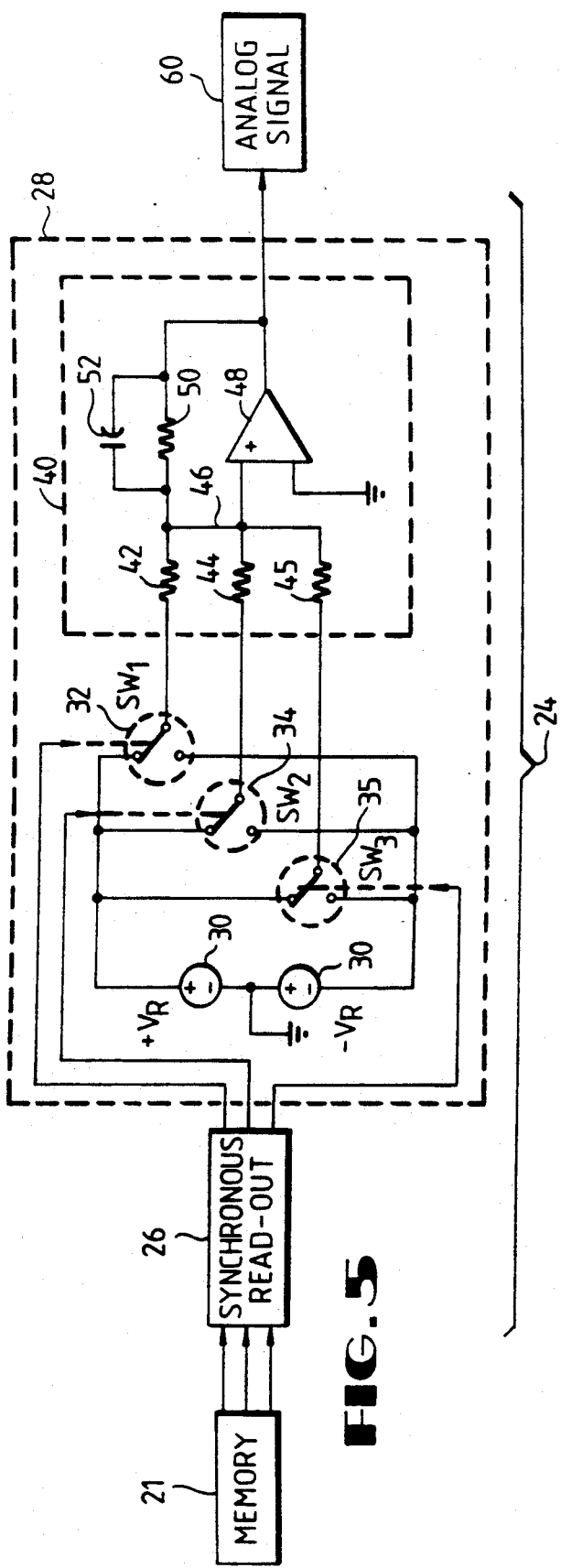
FIG. 5 illustrates a block diagram of another preferred embodiment of a memory readout and decoding circuit.

Turning now to FIG. 5, another embodiment of the decoder circuit is illustrated, in which an additional correction signal digital bitstream is used to further refine the resultant signal. In this embodiment, further iterations of the distortion estimator 12 and correction signal encoder 20 yield one or more additional correction signal bitstream segments that are also stored in memory 21. It should be noted that additional correction signals may also be used to reduce the noise components outside the band of interest. Thus, an additional correction signal bitstream is read out synchronously with the data signal bitstream in memory 21 and the first correction signal bitstream in memory 21. The only modifications necessary to the decoder circuit 28 to employ additional correction signals entail the addition of an additional switch $SW_3$ 35 for each bitstream, similar to switch $SW_2$ 34, with the output from each additional switch connected to an additional resistor 45 similar to resistor 44. Each additional correction signal is then summed along with the data signals and the first correction signal at the summing connection 46.

I claim:

1. A signal generator for generating a correction signal from a digital data signal for forming a low distortion analog signal, comprising:
   a data signal source for outputting a segment of said digital data signal;
   a storage device having an input coupled to the output of said data signal source for storing said segment of said digital data signal;
   a distortion estimator having an input coupled to the output of said data signal source and operable to determine signal distortion characteristics of said segment of said digital data signal when said segment is repetitively read out from said storage device and converted to an analog data signal;
   a correction signal encoder adapted to encode the output of said distortion estimator into a segment of digital correction signal having opposite phase and increased amplitude form said signal distortion phase and amplitude of said output of said distortion estimator, and having an output coupled to said input of said storage device for outputting said segment of digital correction signal to said storage device.

2. A signal generator according to claim 1, wherein said data signal source includes:
   a waveform generator for generating a digital representation of a periodic waveform; and
   a data signal encoder for encoding said digital representation of said periodic waveform into said digital data signal segment.

3. A signal generator according to claim 2, wherein each said segment corresponds to one period of said periodic waveform.

4. A signal generator according to claim 2, wherein said data signal encoder and said correction signal encoder are adapted to simulate an oversampled sigma delta encoder.

5. A signal generator according to claim 2, wherein said data signal encoder and said correction signal encoder have parameters for encoding said digital data signal segment and said digital correction signal segment as 1-bit digital bitstreams.

6. A signal generator according to claim 1, further comprising:
   a digital to analog decoder for synchronously reading said digital data signal segment and digital correction signal segment out of said storage device, converting said repetitively read out digital data signal segment into an analog data signal and said repetitively read out digital correction signal segment into an analog correction signal, combining said analog signals so as to reduce the signal distortion in said analog data signal, and outputting the combined analog signal.

7. A signal generator according to claim 6, wherein said digital to analog decoder includes:

a reference voltage source having a first and second reference voltage;

a first switch having a switch control input operable to receive said digital data signal segment a it is repetitively read out of said storage device, a first voltage input coupled to receive said first reference voltage, a second voltage input coupled to receive said second reference voltage, and an output, for switching the connection between said first and second voltage inputs and said output in response to said repetitively read out digital data signal segment received in said switch control input;

a second switch having a switch control input operable to receive said digital correction signal segment as it is repetitively read out of storage device, a first voltage input coupled to receive said first reference voltage, a second voltage input coupled to receive said second reference voltage, and an output, for switching the connection between said first and second voltage inputs and said output in response to said repetitively read out digital correction signal segment received in said switch control input; and a summing low pass filter having a first resistor coupled to the output of said first switch, a second resistor coupled to the output of said second switch, a summer coupled to the output of said first and second resistors, and a low pass filter coupled to the summer, for providing an analog signal output.

8. A signal generator according to claim 7, wherein said correction signal encoder has parameters such that the output of said distortion estimator is encoded into a digital correction signal having an amplitude increased by a scale factor greater than one.

9. A signal generator according to claim 8, further comprising a scaling member coupled to the output of said second switch for decreasing the amplitude of said correction analog signal to approximately the same amount as said amplitude of the signal distortion in a frequency band of interest of said data analog signal.

10. A signal generator according to claim 6, wherein said data signal source, correction signal encoder, distortion estimator, and digital to analog decoder have parameters for outputting from said decoder a low distortion analog signal having a signal to noise ratio greater than about 120 dB.

11. A signal generator according to claim 6, wherein said digital data signal segment is a digital encoding of a digital representation of a periodic waveform, and said data signal source, distortion estimator, correction signal encoder, and digital to analog decoder have parameters for outputting from said decoder an analog signal approximately equivalent to said periodic waveform.

12. A signal generator according to claim 1, wherein said correction signal encoder has parameters for encoding said segment of digital correction signal within a selected frequency band to have opposite phase and increased amplitude from said signal distortion phase and amplitude of said output of said distortion estimator.

13. A signal generator comprising:
a waveform generator for generating a digital representation of a periodic waveform;
a first encoder for encoding the output of said waveform generator into a data signal digital bitstream segment corresponding to one period of said periodic waveform;
a distortion estimator for determining the phase and amplitude of signal distortion within a frequency band of interest created by repetitively decoding said data signal digital bitstream segment into an analog signal, and generating a distortion digital datastream having an amplitude increased by a scale factor greater than one from said amplitude, and an opposite phase from said phase, of said signal distortion; and
a second encoder for encoding said distortion digital datastream into a correction signal digital bitstream segment corresponding to the same period of said periodic waveform as said data signal digital bitstream segment.

14. A signal generator according to claim 13, further comprising:
a memory for storing said data signal digital bitstream segment outputted from said first encoder and said correction signal digital bitstream segment outputted from said second encoder;
a readout for synchronously and repetitively reading out said data signal digital bitstream segment and said correction signal digital bitstream segment from said memory;
a reference voltage source having a first and second reference voltage;
a first switch having a switch control input coupled to said readout for receiving said data signal digital bitstream segment, a first voltage input coupled to receive said first reference voltage, a second voltage input coupled to receive said second reference voltage, and an output, for switching the connection between said first and second voltage inputs and said output, as the bit values of said repetitively read out data signal digital bitstream segment received in said switch control input change, and converting said repetitively read out data signal digital bitstream segment into a data analog signal;
a second switch having a switch control input coupled to said readout for receiving said correction signal digital bitstream segment, a first voltage input coupled to receive said first reference voltage, a second voltage input coupled to receive said second reference voltage, and an output, for switching the connection between said first and second voltage inputs and said output, as the bit values of the repetitively read out correction signal digital bitstream segment received in said switch control input change, and converting said repetitively read out correction signal digital bitstream segment to a correction analog signal;
a scaling member coupled to the output of said second switch for decreasing the amplitude of said correction analog signal to approximately the same amount as said amplitude of the signal distortion in said band of interest of said data analog signal;
a summer coupled to the output of said scaling member and said first switch for summing said data analog signal and said correction analog signal; and
a filter for filtering signal distortion outside said frequency band of interest in the signal output from said summer, and for outputting an analog signal.

15. A method of generating a correction signal for forming an analog signal having low distortion within a frequency band of interest, comprising the steps of:
outputting from a data signal source a segment of digital data signal having known frequency, amplitude and phase characteristics and having, when repetitively decoded, a signal distortion having frequency, amplitude, and phase characteristics;

determining frequency, amplitude, and phase characteristics within said frequency band of interest which said signal distortion of said segment of digital data signal will have when it is repetitively decoded; and encoding said determined characteristics into a segment of a digital correction signal of opposite phase and increased amplitude from said determined characteristics.

16. A method of generating a correction signal according to claim 15, wherein the segment of digital data signal is outputted by outputting a digital representation of a periodic waveform from a waveform generator, and encoding said digital representation of said periodic waveform into said segment of said digital data signal.

17. A method of generating a correction signal according to claim 16, wherein the steps of encoding said digital representation of a periodic waveform, and encoding said determined characteristics, are accomplished by simulating an oversampled sigma delta encoder.

18. A method of generating an analog signal according to claim 16, wherein the step of encoding a digital representation of a periodic waveform wherein:

the step of outputting a digital representation of a periodic waveform comprises outputting a segment of aid digital data signal corresponding to one period of said digital representation of a periodic waveform from which said digital data signal is encoded, which segment, when repetitively decoded, is converted into an analog waveform substantially equivalent to said digital representation of the periodic waveform from which said digital data signal is encoded;

and the step of encoding said determined characteristics comprises:

outputting a segment of said digital correction signal corresponding to the same period of said digital representation of the periodic waveform as the segment of said outputted digital data signal segment.

19. A method of generating a correction signal according to claim 15, further comprising the steps of:

storing said segment of digital data signal and said segment of digital correction signal in a memory;

reading out repetitively and synchronously said digital data signal segment and said digital correction signal segment from said memory; and decoding said repetitively read out digital data and correction signal segments and summing the decoded signal segments to form said low distortion analog signal.

20. A method of generating a correction signal according to claim 19, wherein the step of decoding and summing said data and correction signals to form said low distortion analog signal includes:

applying a reference voltage to a decoding circuit having a first and a second switch and summing low pass filter, such that one input of each switch will have a first reference voltage and another input will have a second reference voltage;

switching a first switch connection between the input receiving said first reference voltage and the input receiving said second reference voltage, alternating as a bit value of said repetitively read out digital data signal segment input into said first switch connection changes, for decoding said repetitively read to digital data signal segment into an analog data signal;

switching a second witch connection between the input receiving said first reference voltage and the input receiving said second reference voltage, alternating as a bit value of said repetitively read to digital correction signal segment input into said second switch connection changes, for decoding said repetitively read out digital correction signal segment into an analog correction signal;

scaling at least one frequency amplitude of said analog correction signal to approximately match at least one signal distortion frequency amplitude of said analog data signal within said band of interest;

summing said analog data signal and scaled analog correction signal; and filtering a signal distortion of the summed signals outside said band of interest.

21. The method of claim 19, wherein said low distortion analog signal has a signal to noise ratio of at least 120 dB.

22. A method of generating an analog signal according to claim 19, wherein the step of encoding said determined characteristics further comprises encoding said determined characteristics into a digital correction signal having frequency, phase and amplitude characteristics for forming, following the steps of reading out and decoding said digital data and correction signals and summing said decoded signals, an analog signal having a signal to noise ratio greater than about 120 dB.

23. A method of generating an analog signal according to claim 15, wherein the step of encoding said digital correction signal includes encoding said determined characteristics into a digital correction signal having an amplitude greater than the amplitude of said determined characteristics.

24. A method of generating a correction signal from a data signal for forming a low distortion analog signal, comprising the steps of:

generating a digital representation of a periodic waveform;

computationally encoding said digital representation of a periodic waveform into a data signal digital bitstream segment corresponding to one period of said periodic waveform, having known frequency, amplitude and phase characteristics, and having, when repetitively decoded, a signal distortion having frequency, amplitude, and phase characteristics;

storing said data signal digital bitstream segment in a memory;

computationally determining frequency, phase and amplitude characteristics within a frequency band of interest which said signal distortion of said data signal digital bitstream segment will have when said data signal digital bitstream segment is repetitively decoded into an analog signal;

computationally encoding said determined frequency, phase and amplitude characteristics into a correction signal digital bitstream segment corresponding to approximately the same period of said periodic waveform as said data signal digital bitstream segment, and having increased amplitude by a scale factor greater than one and opposite phase from said determined frequency, phase and amplitude characteristics; and storing said correction signal digital bitstream segment in said memory.

25. A method of generating a correction signal for forming a low distortion analog signal according to claim 24, further comprising the steps of:
reading out repetitively and synchronously said data signal digital bitstream segment and said correction signal digital bitstream segment from said memory;
applying a reference voltage to a decoding circuit having a first and a second switch and a summing band pass filter, such that one input of each switch will have a first reference voltage and another input of each switch will have a second reference voltage;
switching a first switch connection, between said switch input receiving said first reference voltage and said switch input receiving said second reference voltage, alternating as bit values of said data signal digital bitstream input into said first switch connection change, for decoding said digital data signal into a data analog signal;
switching a second switch connection, between said switch input receiving said first reference voltage and said switch input receiving said second reference voltage, alternating as bit values of said correction signal digital bitstream input into said first switch connection change, for decoding said correction signal digital bitstream into a correction analog signal;
scaling frequency amplitudes of said correction analog signal within said band of interest to approximately match frequency amplitudes of said signal distortion in said repetitively decoded digital data signal; and
summing the data analog signal and scaled correction analog signal to form said low distortion analog signal.

26. The method of claim 25, wherein said low distortion analog signal has a signal to noise ratio of at least 120 dB.

27. A method of making a low noise analog signal of a given frequency, which comprises:
transforming a time-domain digital data signal into the frequency domain to include a first frequency component corresponding to said given frequency and at least one other frequency component corresponding to noise;
inverse transforming at least one of said other frequency components within a frequency band of interest into a time domain digital correction signal; and
storing said digital data signal and digital correction signal.

28. The method of claim 27, which further comprises:
inverting the phase of said digital correction signal into the opposite phase;
converting said digital data signal and said digital correction signal into analog signals; and
synchronously summing said analog signals to form a low noise analog signal.

29. The method of claim 28, wherein said low noise analog signal has a signal to noise ratio of at least 120 dB.

30. The method of claim 28, which further comprises:
scaling up the amplitude of said digital correction signal; and
scaling down the amplitude of said second continuous analog signal before it has been synchronously summed with said continuous analog signal.

31. The method of claim 30, wherein said digital data signal is a one-bit bitstream.

32. The method of claim 27, wherein the step of converting and synchronously summing said digital data signal and said digital correction signal into analog signals comprises:
repetitively reproducing the stored said digital data signal and converting said repetitively reproduced digital data signal into a continuous analog signal;
repetitively reproducing the stored said digital correction signal and converting said repetitively reproduced digital correction signal into a second continuous analog signal; and
synchronously summing said continuous analog signal and said second continuous analog signal to form a low noise analog signal.

33. An analog signal generator comprising:
an encoder for encoding a first digital representation of a period waveform into a data signal digital datastream and a correction signal digital datastream;
a memory for storing the two digital datastreams; and
a digital to analog decoder for synchronously reading the two datastreams out of the memory, combining the two datastreams so as to correct the data signal digital datastream for distortions, and outputting a corrected analog signal.

34. The generator of claim 33, wherein the decoder is operable to repetitively read the two datastreams out of said memory prior to combining the two datastreams.

* * * * *

UNITED STATES PATENT AND TRADEMARK OFFICE
CERTIFICATE OF CORRECTION

PATENT NO. : 5,182,558
DATED : January 26, 1993
INVENTOR(S) : Frank Mayo

It is certified that error appears in the above-indentified patent and that said Letters Patent is hereby corrected as shown below:

Column 2, Line 62, replace "to" with --or--.

Column 3, Line 41, replace "form" with --from--.

Column 4, Line 21, replace "form" with --from--.

Column 4, Line 49, replace "bene" with --been--.

Column 5, Line 38, replace "form" with --from--.

Column 5, Line 52, replace "FIG. 1" with --FIG. 2--.

Column 6, Line 12, replace "this" with --This--.

Column 6, Line 13, replace "is" with --in--.

Column 6, Line 36, replace "s" with --as--.

Column 6, Line 46, replace "store" with --stores--.

Column 6, Line 60, replace "ay" with --may--.

UNITED STATES PATENT AND TRADEMARK OFFICE
CERTIFICATE OF CORRECTION

PATENT NO. : 5,182,558
DATED : January 26, 1993
INVENTOR(S) : Frank Mayo

It is certified that error appears in the above-indentified patent and that said Letters Patent is hereby corrected as shown below:

Column 7, Line 41, replace "$(a(d^i))$" should read --$(a(t_i))$--

Column 8, Line 49, replace "$(l\tau))$" with --$(l/\tau))$--.

Column 9, Line 16, replace "$f^r l,$" should read --$f_r/\mathcal{L},$--

Column 11, Line 24, replace "to" with --and--.

Claim 1, Column 12, Line 29, replace "form" with --from--.

Claim 7, Column 13, Line 4, replace "a" with --as--.

Claim 7, Column 13, Line 15, insert --said-- between "of" and "storage".

Claim 18, Column 15, Line 29, replace "aid" with --said--.

Claim 20, Column 16, Line 2, replace "to" with --out--.

Claim 20, Column 16, Line 4, replace "witch" with --switch--.

Claim 20, Column 16, Line 7, replace "to" with --out--.

UNITED STATES PATENT AND TRADEMARK OFFICE
CERTIFICATE OF CORRECTION

PATENT NO. : 5,182,558

DATED : January 26, 1993

INVENTOR(S) : Frank Mayo

It is certified that error appears in the above-indentified patent and that said Letters Patent is hereby corrected as shown below:

Column 9, line 15, "f=b" should read —f= —.

Signed and Sealed this

Twenty-ninth Day of March, 1994

Attest:

BRUCE LEHMAN

Attesting Officer     Commissioner of Patents and Trademarks